United States Patent [19]
Gill

[11] Patent Number: 5,521,110
[45] Date of Patent: May 28, 1996

[54] METHOD OF MAKING EEPROM DEVICES WITH SMALLER CELL SIZE

[75] Inventor: Manzur Gill, Saratoga, Calif.

[73] Assignee: National Semiconductor Corporation, Santa Clara, Calif.

[21] Appl. No.: 525,286

[22] Filed: Sep. 8, 1995

Related U.S. Application Data

[62] Division of Ser. No. 365,208, Dec. 28, 1994.

[51] Int. Cl.[6] .............................................. H01L 21/8247
[52] U.S. Cl. .................... 437/43; 437/49; 437/70; 437/984
[58] Field of Search ...................... 437/43, 49, 69, 437/70, 984

[56] References Cited

U.S. PATENT DOCUMENTS

| | | | |
|---|---|---|---|
| 5,091,326 | 2/1992 | Haskell | 437/43 |
| 5,151,375 | 9/1992 | Kazerounion et al. | 437/43 |
| 5,371,031 | 12/1994 | Gill et al. | 437/43 |

*Primary Examiner*—Chandra Chaudhari
*Attorney, Agent, or Firm*—Limbach & Limbach

[57] ABSTRACT

An EEPROM and method for making the same, having precisely shaped field oxide regions and memory cells, to provide improved electrical operating characteristics and increased memory density. A layer of field oxide is grown over an n-type substrate having a p-well and the layer of field oxide is selectively etched to form rows of field oxide. Rows of tunnel oxide are formed between the rows of field oxide. A first layer of polysilicon, or poly-1, is formed over the wafer and a layer of ONO is formed over the poly-1. Using the same mask, the ONO, poly-1, field oxide, and tunnel oxide are stack etched. Bit lines are formed, followed by oxide spacers. A second layer of polysilicon, or poly-2 is formed and selectively etched to form word lines. The exposed ONO and poly-1 are etched using the same mask to form floating gate regions. Subsequent process steps provide word lines to metal dielectric, contacts, metal and passivation.

5 Claims, 8 Drawing Sheets

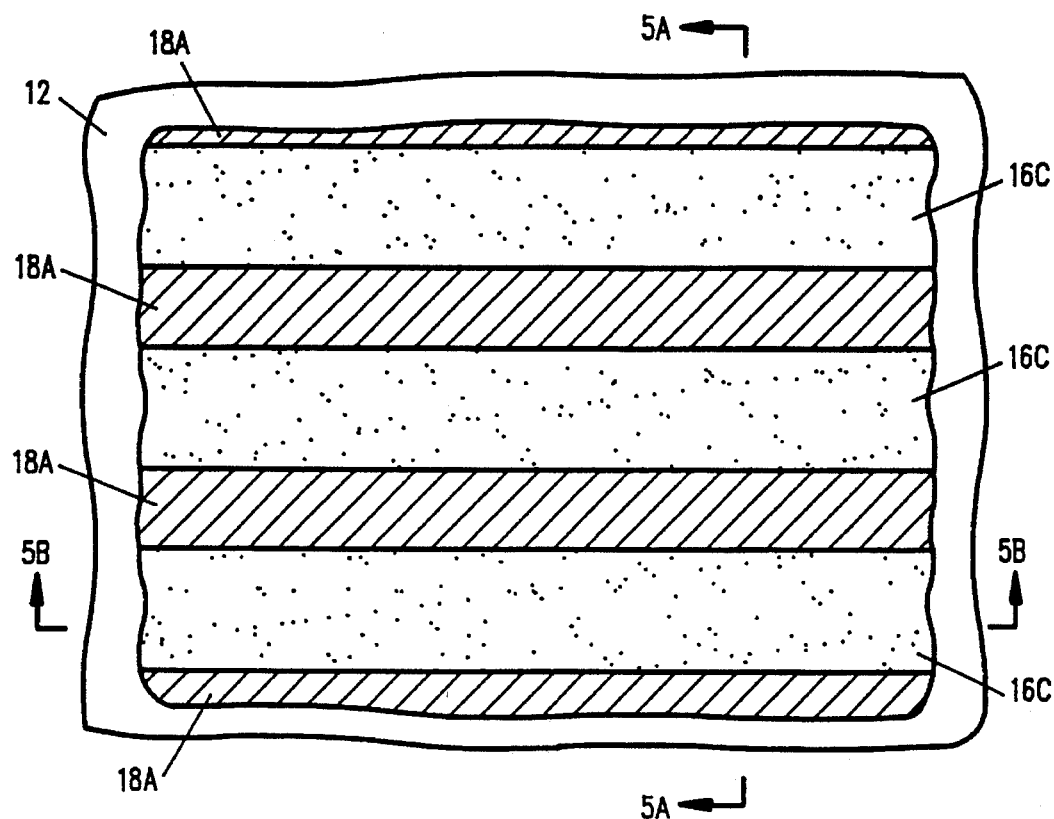
FIG. 5
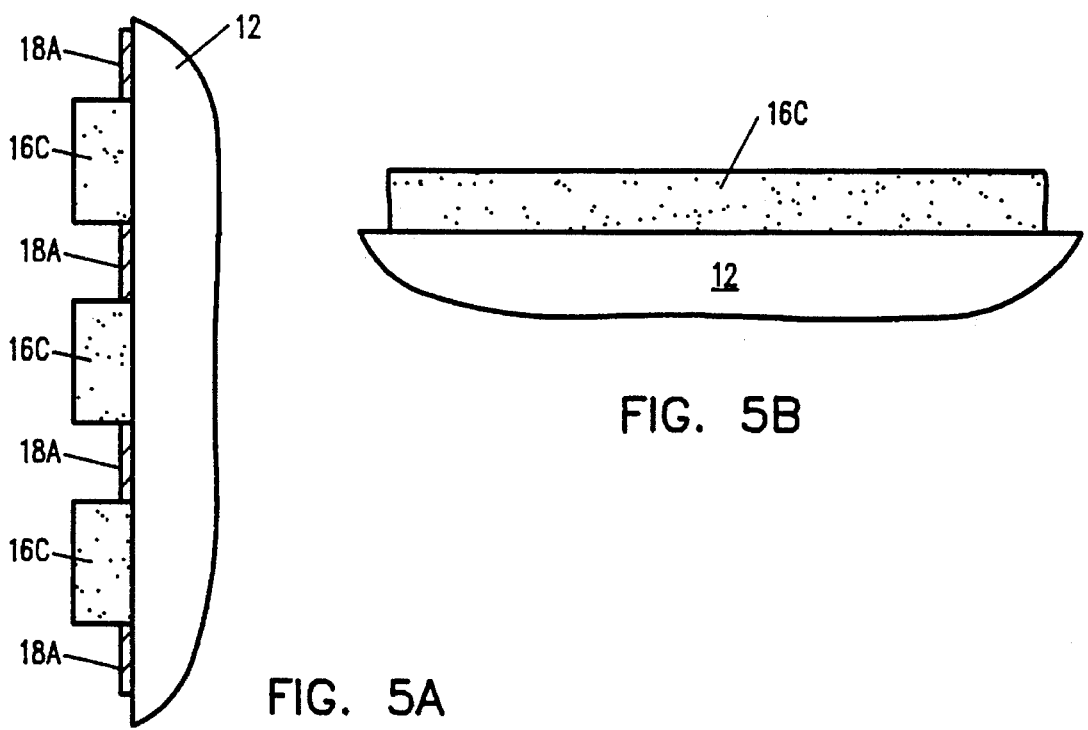
FIG. 5B
FIG. 5A

METHOD OF MAKING EEPROM DEVICES WITH SMALLER CELL SIZE

This is a divisional of application Ser. No. 08/365,208, filed Dec. 28, 1994.

RELATED PATENT APPLICATIONS

This application discloses subject matter also disclosed in co-pending U.S. patent application entitled FLASH EEPROM MEMORY ARRAY, U.S. patent application Ser. No. 08/365,210, filed on even date herewith which is also assigned to National Semiconductor Corporation, which foregoing application is hereby incorporated by reference.

BACKGROUND OF THE INVENTION

1. Field of the Invention

The present invention relates to Electrically Erasable, Electrically Programmable Read Only Memories (EEPROMs), and more particularly but not by way of limitation, to an EEPROM with precisely shaped and placed memory cell elements.

2. Discussion

An Electrically-Erasable, Electrically Programmable Read Only Memory (EEPROM) is a semiconductor device that generally uses field effect transistor memory cells with floating gate structures to store data in a memory array. A fundamental measure of an EEPROM's cost is its chip size. The smaller the chip size, the more chips can be fit onto a fixed-cost silicon wafer. Because the memory array is a large part of the total chip, shrinking the size of each memory cell transistor is one way to minimize chip size. Thus, advances in the art that improve the shape or placement of an element of a memory cell are of great commercial significance.

In current EEPROMs, including Flash EEPROMs herein, memory cells are isolated by the placement of $SiO_2$, or "field oxide," in the area surrounding a memory cell. The field oxide in typical CMOS memory technologies is formed by a process known as local oxidation of silicon (LOCOS). LOCOS is well known to have certain problems that affect the shape and placement of the field oxide. These problems include (i) the bird's head effect (recessed LOCOS); (ii) the bird's beak effect; and (iii) the white ribbon effect, commonly called the Kooi effect.

The first two of these problems are closely related. In the LOCOS process, a mask is formed and oxide is grown in the exposed regions. At the edges of the mask, however, some oxidant diffuses laterally, resulting in a slowly tapering oxide wedge. The deformation causes a corresponding imprecision in the placement of the field oxide regions with respect to the other elements of the memory cells. Elements of the memory array which could theoretically be perfectly aligned with the edge of the field oxide regions must be offset to allow for the uncertainty in the thickness of the field oxide at the edges. This resulting misalignment limits the minimum distance between memory cells.

Certain other problems inherent in the LOCOS process serve to further increase the distance between memory cells. For example, in processes that use LOCOS to form the field oxide regions of the memory array, various mask steps are required in forming additional elements of the array. Each mask step has a degree of uncertainty associated with the placement of the mask, resulting in a corresponding uncertainty in the placement of the memory element associated with that step of the process. Subsequent mask steps that must align with the memory element not only must compensate for the uncertainty in the placement of the mask, but must also compensate for the uncertainty in the location of the memory element.

In addition, although the field oxide is typically designed to have rectangular sides, photolithographic effects cause the corners of the field oxide to be somewhat rounded, resulting in a field oxide with an oblong shape. The combination of the above effects can cause non-identical adjacent cells, resulting in a broad array erase distribution. Thus, LOCOS field oxide formation results in limitations on desired field oxide shape and placement, necessitating a decreased cell density on the chip.

In addition to the degradation of the shape and placement of the field oxide, the above problems with the LOCOS process also degrade the performance of memory cells in the array. Because the deformation of the field oxide occurs at the edges, the deformation is not generally detrimental to memory cell performance where the memory cell geometries are relatively large. In modern devices with relatively small geometries, however, the detrimental effects of LOCOS field oxide deformation on memory cell performance can be significant.

The capacitive coupling between control gates and floating gates in the memory cell array is improved by extending the floating gate onto field oxide regions adjacent each cell. In particular, degradation of the shape of the field oxide regions impacts the capacitive coupling ratio $K_1$ between the memory cell control gate and floating gate and the capacitive coupling ratio $K_2$ between the control gate and the drain. These important design parameters are defined by:

$$K_1 = C_1/C_T$$

and $$K_2 = C_3/C_T$$

where $$C_T = C_2 + C_3 + C_4 + C_5$$

and $C_1$ = capacitance between control gate and the floating gate.

$C_2$ = capacitance between floating gate and the source.

$C_3$ = capacitance between floating gate and the drain.

$C_4$ = capacitance between floating gate and the channel.

$C_5$ = capacitance between floating gate and the substrate.

These capacitances are shown schematically in FIG. 1. $C_5$ the capacitance between floating gate and the substrate through the field oxide can be of importance because of the large coupling area between the floating gate and the control gate located over the field oxide. Thus, variations from the assumed values in $C_5$ can cause significant change in the key design parameters $K_1$ and $K_2$.

Improving the capacitive coupling ratio $K_1$ between the control gate and the floating gate allows program and erase operations at reduced control gate voltages, and allows improved reading currents during read operations. As $K_1$ is improved, a greater percentage of the voltage applied to the control gate can be coupled to the floating gate. This relationship is represented by the equation:

$$V_f = K_1 V_g$$

where $V_f$=voltage coupled to the floating gate.

$V_g$=voltage applied at the control gate.

If the field oxide is oblong, however, $K_1$ decreases, requiring a greater voltage to be applied to the control gate to achieve the same potential on the floating gate. In addition, oblong field oxide contributes to a wide erase distribution in a memory array.

Accordingly, there is a need for an EEPROM and a process for making same that has increased precision in the shape and placement of the field oxide regions, improves the capacitive coupling ratio for the memory cells, and tightens the intrinsic erase distribution of a memory array.

SUMMARY OF THE INVENTION

The present invention provides an EEPROM, and method for making the same, having precisely shaped field oxide regions and memory cell transistors, to provide improved electrical operating characteristics and increased memory density.

The EEPROM is made by doping a selected region of an n-type substrate to form a p-well, followed by growing a layer of field oxide over the p-well substantially covering the p-well. The field oxide is selectively etched to form rectangular rows of field oxide. Rows of tunnel oxide are formed over the p-well between the rows of field oxide. A first layer of polysilicon (poly-1) is formed over the entire wafer and the poly-1 is doped and deglazed. An oxide-nitride-oxide (ONO) layer is formed over the layer of poly-1. The ONO layer is masked and, using the same mask, the ONO layer, the poly-1 layer, the rows of field oxide, and the rows of tunnel oxide are etched, resulting in strips of ONO and poly-1 over discrete rectangular field oxide and tunnel oxide regions. Unlike prior art memory arrays, the field oxide regions do not extend beyond the width of the strips of ONO and poly-1; rather, the field oxide regions and the strips of ONO and poly-1 are substantially aligned along the columns and in a vertical direction from the face of the wafer.

Using the same mask, the array region is doped to form n+ bit lines running parallel to and substantially between the poly-1 strips. The mask is then removed and after a cleaning operation, a plurality of oxide spacers are formed over the bit lines. A second layer of polysilicon (poly-2) is formed over the entire wafer and the poly-2 is doped and deglazed. The layer of poly-2 is patterned and the poly-2 is etched to form rows of word lines. Using the same mask, the ONO and poly-1 are etched in the exposed areas between the word lines, the remaining poly-1 regions forming floating gates. The remaining process steps are then performed.

An object of the present invention is to provide an EEPROM with field oxide regions having sides rectangularly shaped, so that cells of uniform width are formed in an array of memory cells.

Another object of the present invention, while achieving the above stated object, is to improve the uniformity of the capacitive coupling ratio $K_1$ between the control gate and the floating gate.

Still another object of the present invention, while achieving the above stated objects, is to improve the uniformity of the capacitive coupling ratio $K_2$ between the control gate and the drain.

Still another object of the present invention, while achieving the above stated objects, is to provide a method for forming the field oxide regions in a memory array that reduces or eliminates the problems associated with the LOCOS method.

Still another object of the present invention, while achieving the above stated objects, is to provide a method for stack etching the tunnel oxide, field oxide, poly-1, and ONO using a single mask to align the field oxide regions with the floating gates to improve the shape and placement of memory cells in the array.

Other objects, features, and advantages of the present invention will become apparent from the following detailed description when read together with the drawings and claims.

BRIEF DESCRIPTION OF THE DRAWINGS

FIG. 5 is a representation of rows of field oxide and tunnel oxide formed on a semiconductor substrate.

FIG. 5A is a cross-sectional view of FIG. 5, taken along the 5A—5A line.

FIG. 5B is a cross-sectional view of FIG. 5, taken along the 5B—5B line.

DISCUSSION

Before describing the apparatus and method of the present invention, prior art LOCOS methods will be briefly discussed in greater detail in order to provide a clearer understanding of the present invention.

Figure 1:
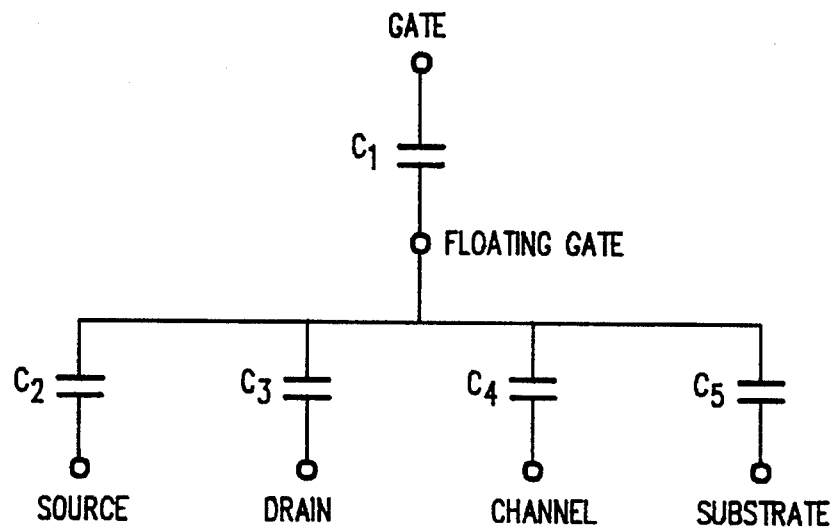
FIG. 1 is a schematic representation of various capacitances within a memory cell of the present invention.
Figure 2:
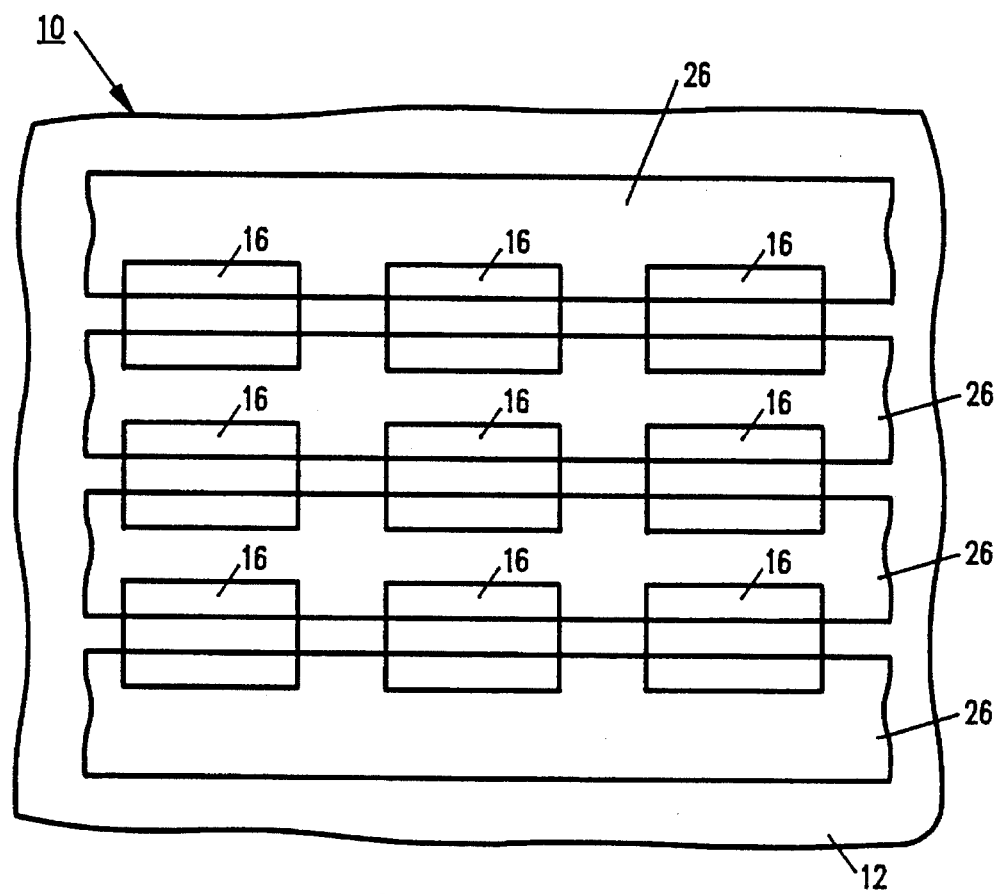
FIG. 2 is a representation of a partial mask set of a prior art memory array.

Referring to FIG. 2, shown is a partial mask set for a prior art Flash EEPROM memory array 10 from U.S. patent application Ser. No. 07/988,293 filed Dec. 8, 1992, and now abandoned, by Albert Bergemont entitled HIGH DENSITY CONTACTLESS FLASH EPROM MEMORY ARRAY USING A CHANNEL ERASE. The Flash EEPROM memory array 10 uses LOCOS to form field oxide. The areas defined in the mask set include an n-type substrate with a p-well 12, field oxide regions 16 and word lines 26. Several layers are not shown, however, including metal lines and contacts. As can be seen, the field oxide regions 16 are intended to be rectangular in shape.

Figure 3:
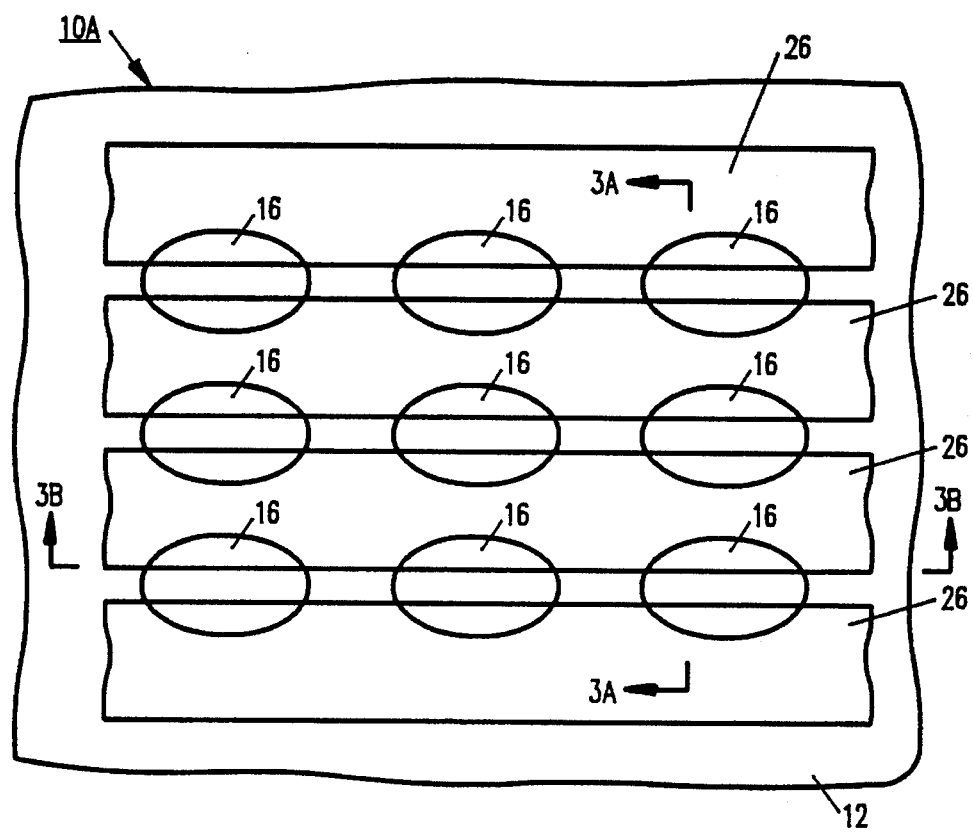
FIG. 3 is a representation of a prior art memory array realized from the partial mask set of FIG. 2.
Figure 3A:
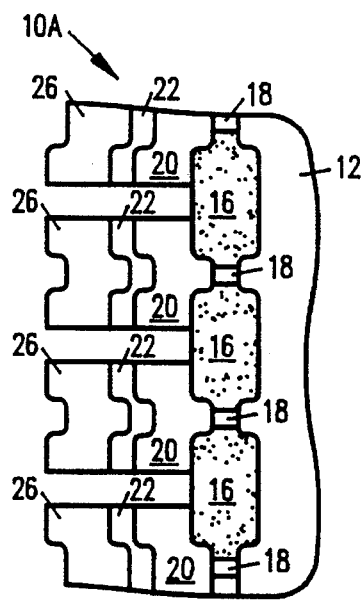
FIG. 3A is a cross-sectional view of the prior art memory array of FIG. 3, taken along the 3A—3A line.
Figure 3B:
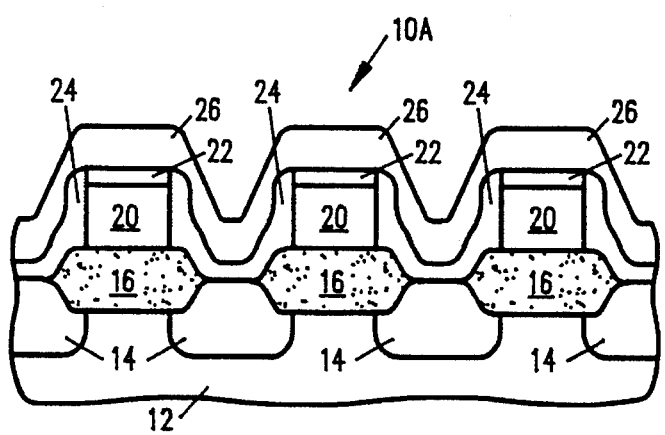
FIG. 3B is a cross-sectional view of the prior art memory array of FIG. 3, taken along the 3B—3B line.

FIG. 3 is a top-view representation of a prior art Flash EEPROM memory array 10A realized from the masks shown in FIG. 2. The oblong-shaped field oxide regions 16 are caused by photolithographic effects that occur during resist exposure. FIG. 3A and FIG. 3B are cross-sectional views showing various layers of the memory array 10A. Of particular note is the shape of the field oxide regions 16, which show the bird's beak effect, typical of LOCOS processing. As previously discussed, these effects limit the minimum distance between memory cells and can negatively affect memory cell performance.

Figure 4:
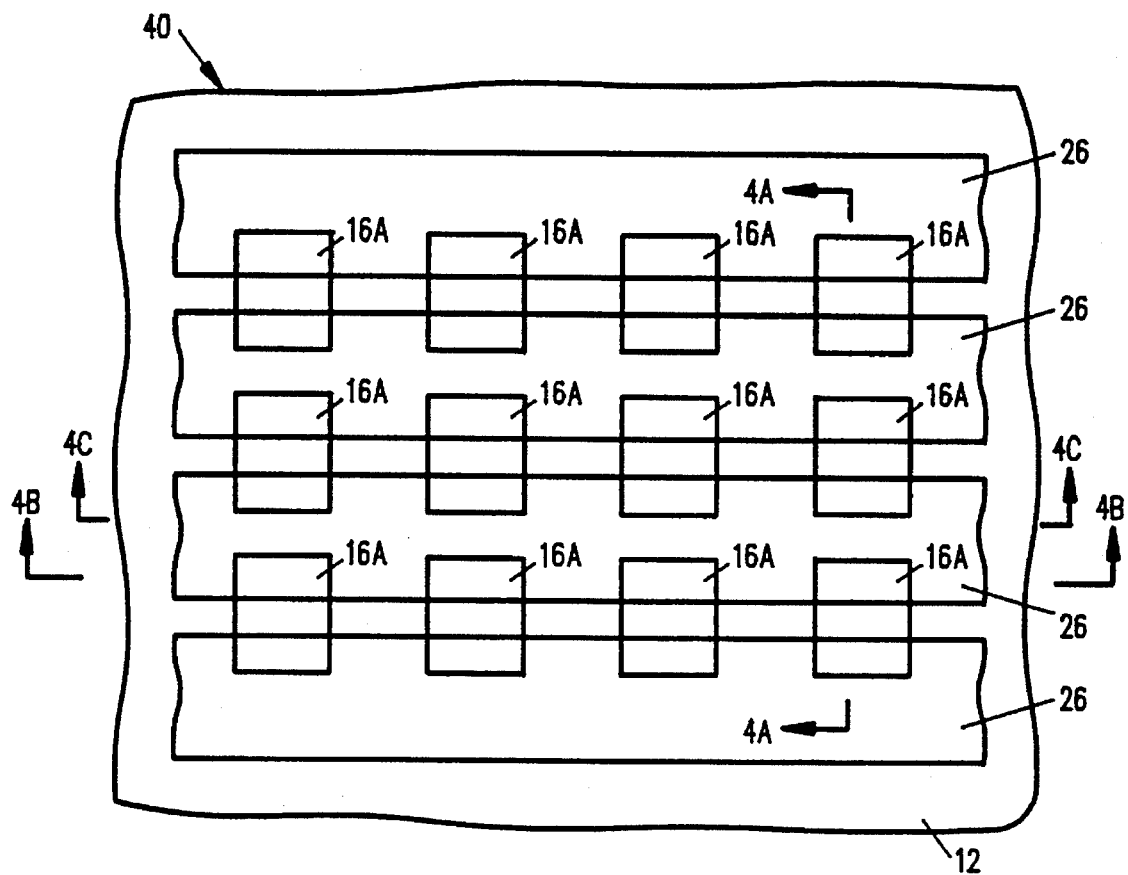
FIG. 4 is a top view representation of a memory array constructed in accordance with the present invention.
Figure 4A:
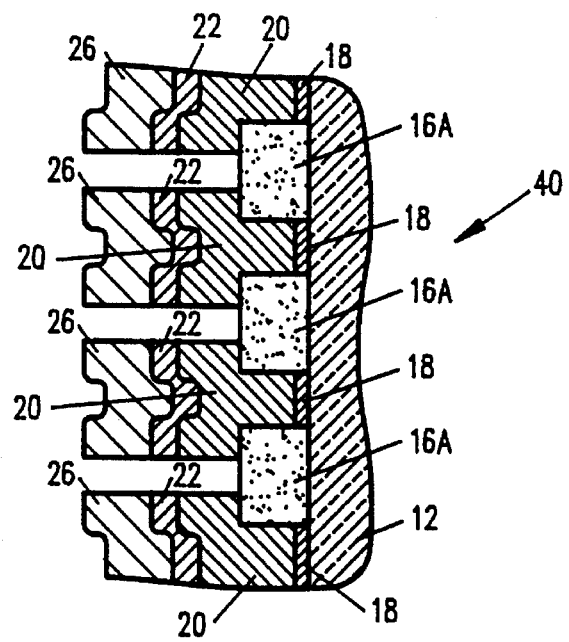
FIG. 4A is a cross-sectional view of the memory array of FIG. 4, taken along the 4A—4A line.
Figure 4B:
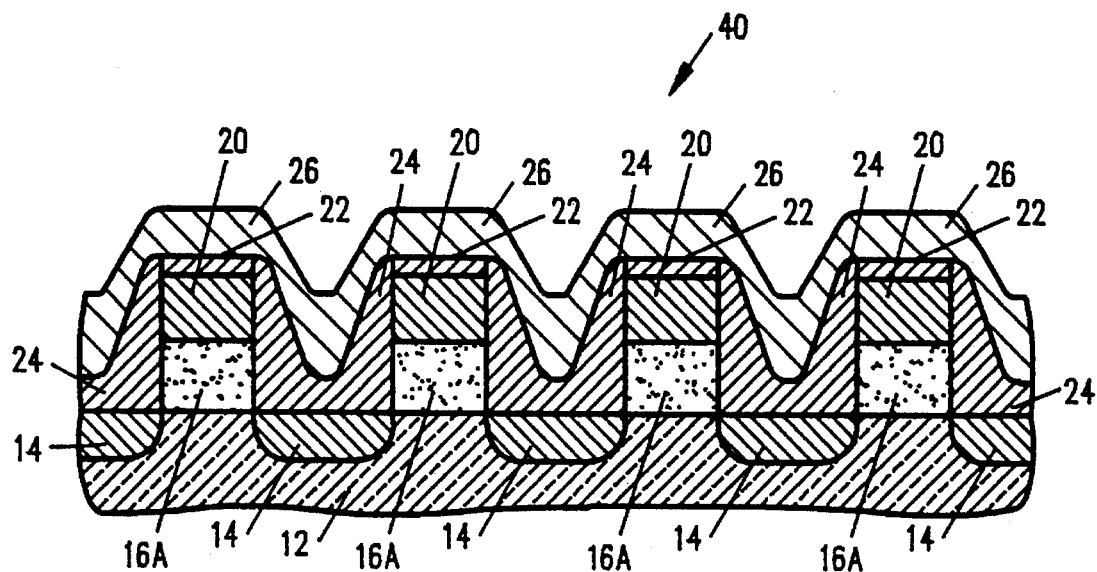
FIG. 4B is a cross-sectional view of the memory array of FIG. 4, taken along the 4B—4B line.
Figure 4C:
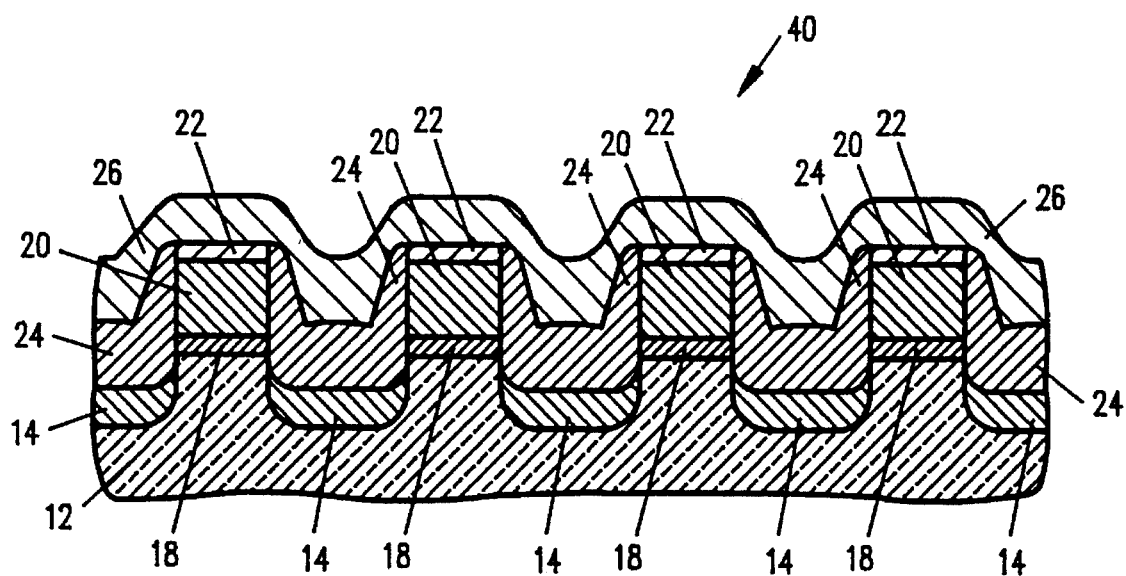
FIG. 4C is a cross-sectional view of the memory array of FIG. 4, taken along the 4C—4C line.

Turning now to the present invention, FIG. 4 represents a top-view representation of a Flash EEPROM memory array 40 having field oxide regions 16A formed in accordance with the present invention. FIG. 4A, FIG. 4B, and FIG. 4C show different cross-sections of the memory array 40.

To particularly describe the apparatus of the present invention, FIG. 4B shows an n-type substrate with the p-well 12 and with bit lines 14 running the width of the memory array 40. Field oxide regions 16A, which are rectangular in shape, are disposed between adjacent bit lines 14 and floating gates 20 are disposed over and between the field oxide regions 16A. The word line 26 is disposed above ONO layers 22, the floating gates 20, the field oxide regions 16A, and bit lines 14 by way of oxide spacers 24. Word lines 26 run the length of the memory array 40 and have control gate regions formed above the floating gates 20.

FIG. 4A and FIG. 4C additionally show tunnel oxide regions 18 disposed under the floating gates 20 and between adjacent field oxide regions 16A.

To particularly describe the method of the present invention, Table I shows the major steps used in fabricating the Flash EEPROM memory array 40 in accordance with the present invention. The formation of CMOS transistors will be omitted.

TABLE I

Major Steps In Making An EEPROM Memory Cell Array

| Major Step | Predominant Function | Region |
|---|---|---|
| 1. | p-well | 12 |
| 2. | field-oxide | 16A |
| 3. | tunnel oxide | 18 |
| 4. | floating gate (poly-1) | 20 |
| 5. | ONO | 22 |
| 6. | stack etch | 16A, 18, 20, 22 |
| 7. | bit line | 14 |
| 8. | word line (poly-2) | 26 |
| 9. | remaining process steps | Not shown |

In Step 1, a <100> n-type silicon wafer substrate is doped to form p-wells 12. To simplify the discussion, references to a wafer substrate should be read to include both the p-wells 12 within the wafer substrate and the remaining regions of the wafer substrate where p-wells are not located.

To form the p-wells 12, appropriate masks are used to selectively implant boron at an energy of about 170 KeV and a dose of about $6 \times 10^{12}$ cm$^{-2}$ into the wafer through a previously formed oxide layer (not shown) of about 250 Å.

The p-wells 12 are driven in at about 1150 degrees Celsius for about 70 to 100 minutes. Resultant oxide (not shown) is then etched. For purposes of this discussion, references to etch steps may incorporate dry etch, wet etch, or a combination of dry etch and wet etch. For PMOS devices to be located in the periphery of the Flash EEPROM, n-wells (not shown) are formed within the p-wells 12. For reference, the p-well junction depth may be in the range of about 6 to 8 μm and the n-well junction depth may be in the range of about 3 to 5 μm.

A 250 Å pad oxide layer (not shown) is grown at about 900 degrees Celsius, followed by a composite nitride layer (not shown) with a thickness of about 2000 Å. A composite mask (not shown) is used to selectively etch the composite nitride layer. An additional mask (not shown) is used to implant boron in the array at an energy of about 30 KeV and a dose of from about 1 to $8 \times 10^{13}$ cm$^{-2}$, for channel stops. Mask resist is stripped, followed by a cleaning operation. At this point, the composite nitride layer has been etched off of the cell array region. Several variations of the channel stop implant process are possible, as is well known.

In Step 2, rows of field oxide 16C, as shown in FIG. 5, FIG. 5A, and FIG. 5B, are formed on the p-well 12. The rows of field oxide 16C in the array may be formed in one of two ways. The first is to grow a layer of field oxide with a thickness of from 2000 to 5000 Å over the array regions. Lithography and oxide etch steps are then used to realize the rows of field oxide 16C from the layer of field oxide. The second way is to use conventional LOCOS methods to grow field oxide in strips to form the rows of field oxide 16C.

In Step 3, rows of tunnel oxide 18A (a first dielectric region) are grown between the rows of field oxide 16C, as shown in FIG. 5, FIG. 5A and FIG. 5B. About 400 Å of sacrificial oxide (not shown) is grown at about 900 to 1000 degrees Celsius, using a mask. A threshold voltage implant is performed with boron at an energy of about 30 KeV and a dose of from about $10^{12}$ to about $5 \times 10^{13}$ cm$^{-2}$. The photoresist is stripped and the sacrificial oxide is etched back. The wafer is cleaned and the rows of tunnel oxide 18A are grown at a temperature of from about 800 to about 900 degrees Celsius to a thickness of from about 90 to about 110 Å.

In Step 4, a first layer of polysilicon, or poly-1 (not shown) is deposited using low-pressure chemical vapor deposition (LPCVD), to a thickness of between about 1500 to 3000 Å over the entire wafer, including the rows of field oxide 16C and tunnel oxide 18A. The poly-1 is doped with an appropriate dopant, such as POCL$_3$ and the poly-1 is deglazed.

In Step 5, a layer of oxide-nitride-oxide or ONO (not shown) is formed by well-known methods over the layer of poly-1. The bottom layer of oxide has a thickness of between about 100 to about 130 Å. The nitride layer has a thickness of about 200 Å, and the top layer of oxide has a thickness of about 40 Å.

Figure 6:
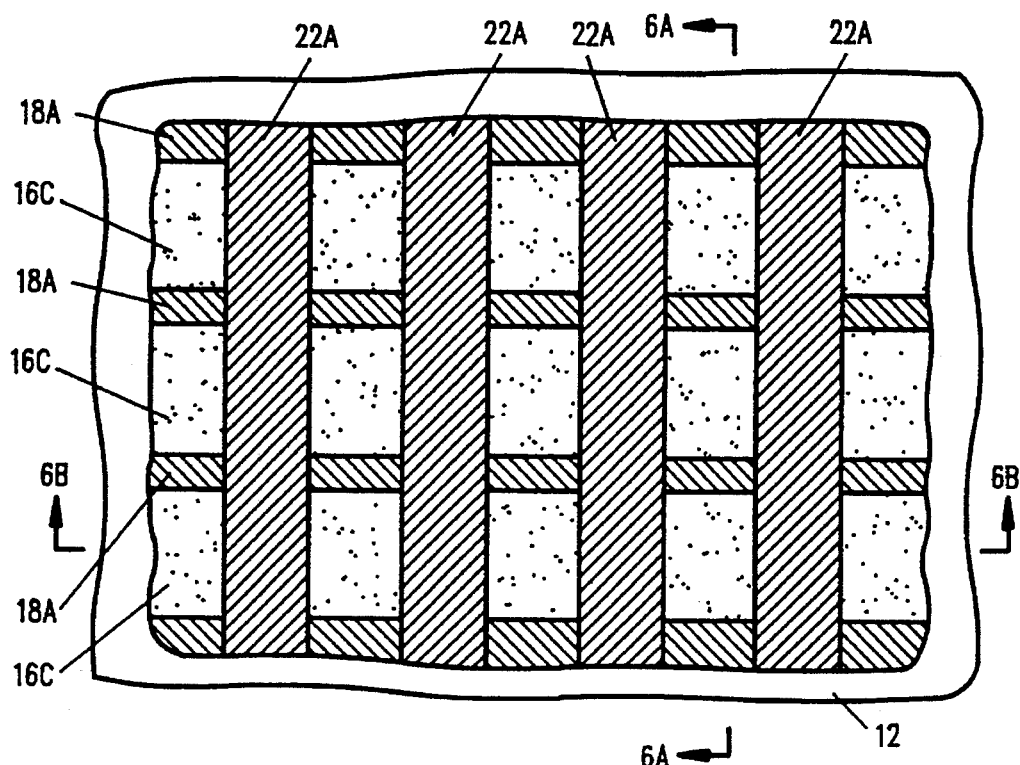
FIG. 6 is a representation of columns of ONO and poly-1 over rows of field oxide and tunnel oxide on a semiconductor substrate.
Figure 6A:
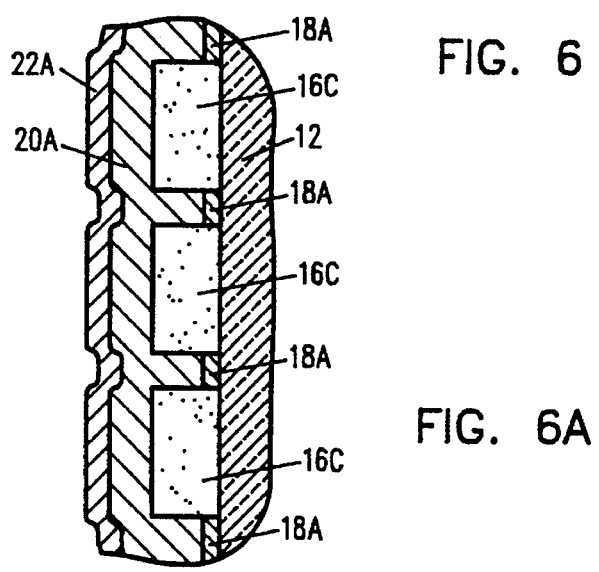
FIG. 6A is a cross-sectional view of FIG. 6, taken along the 6A—6A line.
Figure 6B:
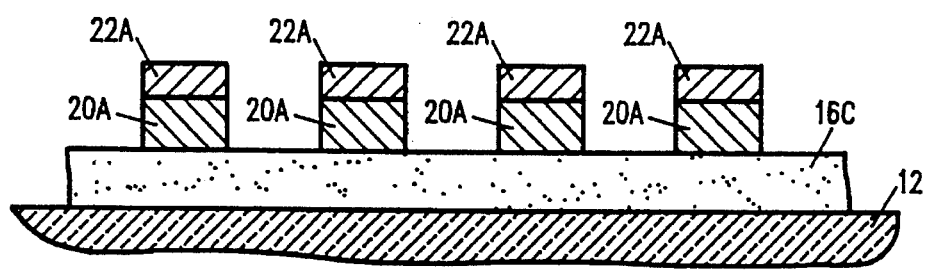
FIG. 6B is a cross-sectional view of FIG. 6, taken along the 6B—6B line.
Figure 7:
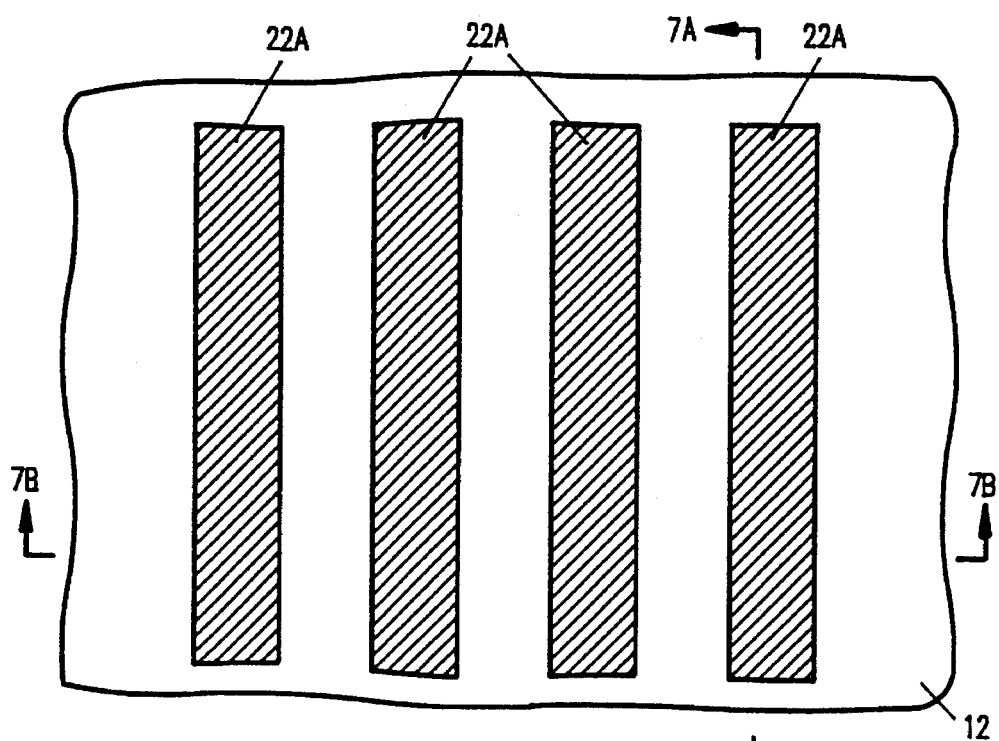
FIG. 7 is a representation of columns of ONO and poly-1 over field oxide and tunnel oxide regions constructed in accordance with the present invention.
Figure 7A:
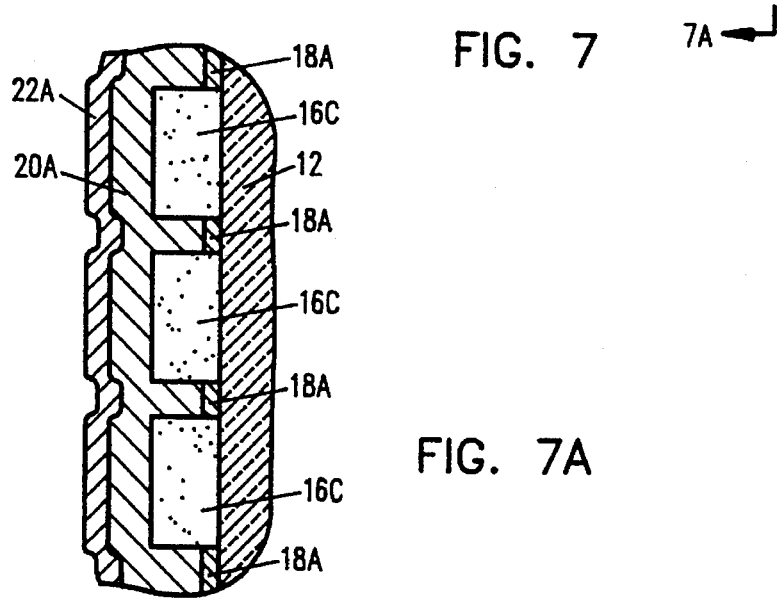
FIG. 7A is a cross-sectional view of FIG. 7, taken along the 7A—7A line.
Figure 7B:
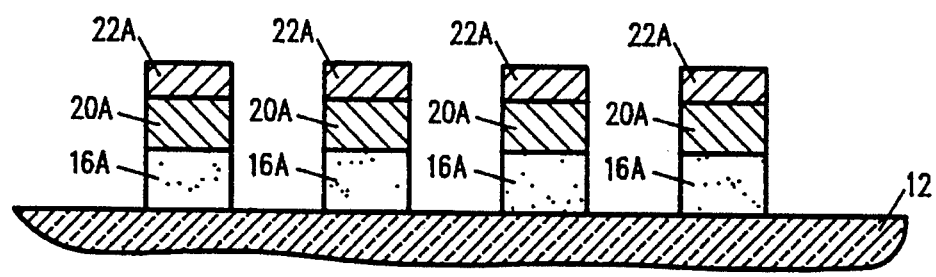
FIG. 7B is a cross-sectional view of FIG. 7, taken along the 7B—7B line.

In step 6, a stack etch is performed on the layer of ONO, the layer of poly-1, the rows of field oxide 16C, and the rows of tunnel oxide 18A. A mask is applied to the layer of ONO and the exposed ONO is etched by way of a suitable etch process. Using the same mask, the exposed poly-1 is then etched, resulting in columns of ONO 22A and columns of poly-1 20A over the rows of field oxide 16C and tunnel oxide 18A, as shown in FIG. 6, FIG. 6A, and FIG. 6B. Continuing with the same mask, the exposed portions of the rows of field oxide 16C and tunnel oxide 18A are then etched using a suitable etch process, forming the regions of field oxide 16A and regions of tunnel oxide 18 under the columns of ONO 22A and poly-1 20A, as shown in FIG. 7, FIG. 7A and FIG. 7B. As can be seen in FIG. 7 and FIG. 7B, the field oxide regions 16A do not significantly extend beyond the width of the columns 22A and 20A. This allows the density of memory cells in the memory array 40 to be increased by locating adjacent columns of memory cells closer together. In addition, mask alignment errors are eliminated by the use of a single mask, further allowing increased density of memory cells.

At the conclusion of Step 6, the field oxide regions 16A are located substantially over the p-well 12, in contrast to the LOCOS method, where the field oxide regions 16 are semi-recessed in the p-well 12, as shown in FIG. 3A and FIG. 3B. In addition, the field oxide regions 16A are rectangular in shape, in contrast to the shape of the LOCOS field oxide regions 16.

In Step 7, continuing with the same mask, the bit lines 14 are formed by implanting arsenic at an energy of about 80 KeV and a dose of about $4 \times 10^{15}$ cm$^{-2}$. The mask is stripped, and the wafer is cleaned by using, in order, hydrofluoric acid, oxygen plasma, and hydrogen peroxide, and/or other wet chemicals. Differential oxidation is next performed by exposing the wafers to oxygen ambient at about 1000 degrees Celsius until an oxide thickness of between about 600 to about 1500 Å is formed over the bit lines. During this oxidation, the exposed edges of the floating gate regions 20 are also oxidized, forming the oxide spacer 24.

In Step 8, a second layer of polysilicon, poly-2 (not shown) is formed at a temperature of 625 degrees Celsius to a thickness of about 2000 Å over the entire wafer. This layer of polysilicon forms the word lines 26 and also the control gate regions. The poly-2 is doped and deglazed. Next, the wafer is precleaned and a 2500 Å thick layer of WSi$_2$ is applied. Word line masking is performed, exposing areas of unwanted WSi$_2$, poly-2, ONO and poly-1 that are then etched off, followed by removal of the photoresist and clean-up. An example of the memory cells formed as a result of the above process is shown in FIG. 4, FIG. 4A, FIG. 4B and FIG. 4C.

In Step 9, the remaining process steps are performed (not shown). An oxidation step is performed, for improving data retention. This oxidation step grows oxide on the exposed edges of WSi$_2$, poly-1, and poly-2. After this, borophosphosilicate glass (not shown) is formed with suitable planarization and reflow steps. Finally, contact, metal and protection overcoat steps are formed.

At this point it may be helpful to note the differences in structure between the present invention and the invention disclosed in the previously referenced and incorporated co-pending U.S. patent application entitled FLASH EEPROM MEMORY ARRAY, U.S. patent application Ser. No. 08/365,210. In the co-pending application, the field oxide regions 16A are wider than the floating gates (poly-1) 20 and the field oxide regions 16A extend over adjacent bit lines 14. In the present invention, the floating gates 20 have the same width and are self-aligned to the field oxide regions 16A as a result of the stack etching of ONO, poly-1, and the field oxide. Further, in the present invention, the field oxide regions 16A do not significantly extend over the adjacent bit lines 14. Comparing FIG. 4B in the co-pending application with FIG. 4B in the present application provides a visual representation of the differences in structure between these two inventions.

Having concluded the discussion of the method of the present invention, methods for programming, reading, and erasing memory cells in the memory array 40 are now discussed.

Figure 8:
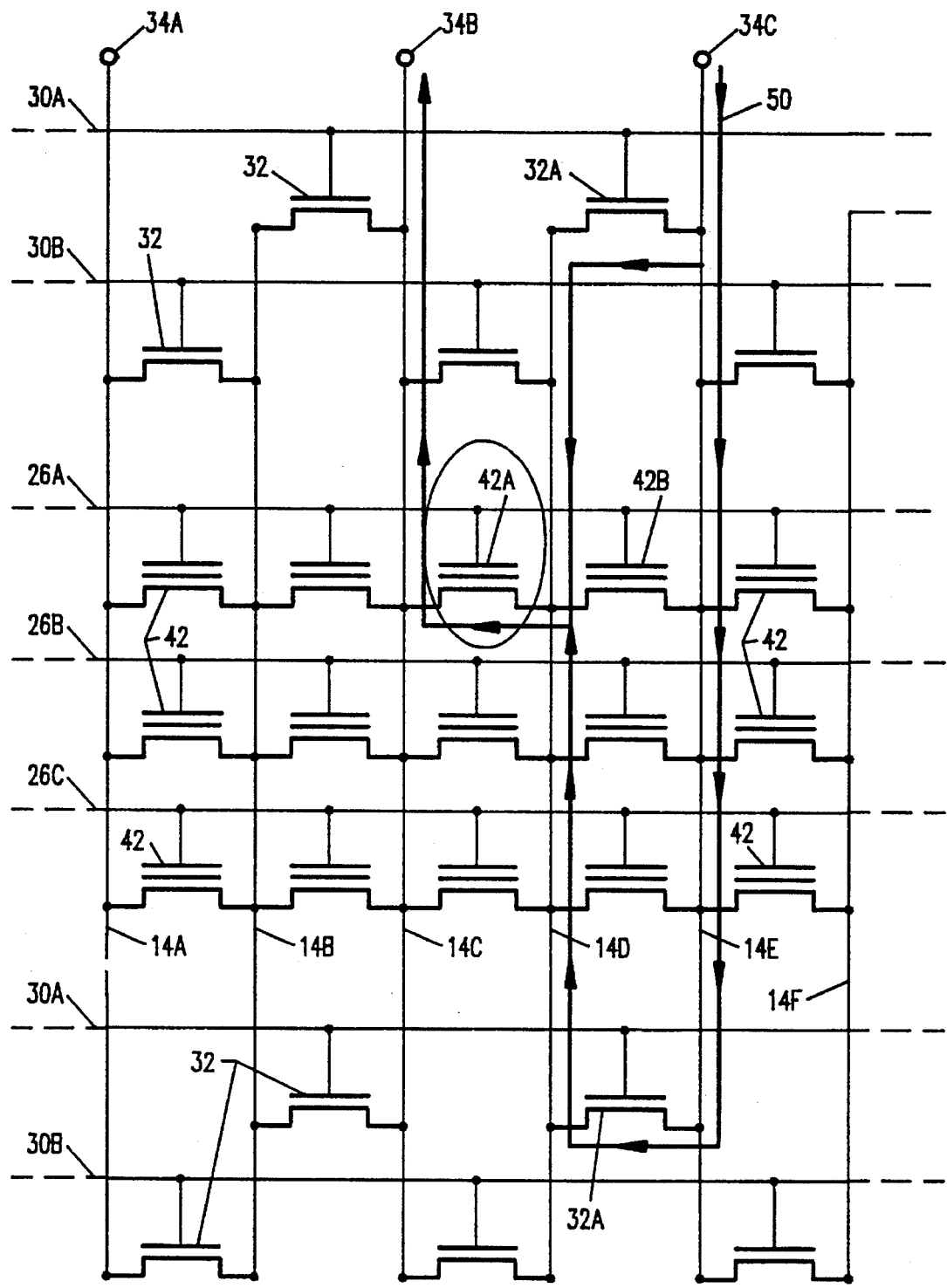
FIG. 8 is a schematic representation of a memory array of the present invention.

Referring to FIG. 8, shown is a schematic representation of a portion of the memory array 40. Word lines 26A, 26B, and 26C, drain bit lines 14A, 14C, and 14E, and source bit lines (herein "source lines") 14B, 14D and 14F connect to memory cells 42 in the memory array 40. Both drain bit lines and source lines are identical except for external connections, and both are formed as previously described in Step 6 of the method description. Access to the bit lines 14A, 14C, and 14E and the source lines 14B, 14D, and 14F is provided by select lines 30A and 30B and select transistors 32. The gate width of select transistors 32 is two or more times the gate width of memory cells 42 to provide low resistance paths between adjacent bit lines and source lines. The select transistors 32 can be cell transistors with wider channels than the memory cells 42, or can be single poly devices.

The select lines 30A and 30B are operated such that a source voltage, $V_{cc}$, is provided to one line and ground, $V_{SS}$, is provided to the other line in order to provide access to the memory cells 42 by way of access points 34A, 34B, and 34C. The access points 34A through 34C are used during program and read operations on the memory cells 42.

Path 50 illustrates a current path used to program and read memory cell 42A. The source voltage $V_{CC}$, perhaps 5 V, is applied to select lines 30A and select lines 30B are grounded, This turns on select transistors 32A. Path 50 thus begins at access point 34C, travels along bit line 14E, across select transistors 32A, along source line 14D, across memory cell 42A, and along bit line 14C to access point 34B. The programming current (as well as the read current) passes through and is shared by a pair of select transistors 32A.

Table II shows the appropriate voltages necessary to program, erase, and read memory cells 42 in the memory array 40.

TABLE II

| Memory Operation | Access Point 34A | Access Point 34B | Access Point 34C | Word Line 26B | Word Line 26A | Select Lines 30A | Select Lines 30B | p-well 12 | substrate |
|---|---|---|---|---|---|---|---|---|---|
| Program Cell 42A | float | $V_{PPD}$ | $V_{SS}$ | $V_{SS}$ | $V_{PP}$ | $V_{CC}$ | $V_{SS}$ | $V_{SS}$ | $V_{CC}$ |
| Program Cell 42B | float | $V_{SS}$ | $V_{PPD}$ | $V_{SS}$ | $V_{PP}$ | $V_{SS}$ | $V_{CC}$ | $V_{SS}$ | $V_{CC}$ |
| Erase Sector 26B | float | float | float | $-V_{EE}$ | $V_{CC}$ | float | float | $V_{CC}$ | $V_{CC}$ |
| Read Cell 42A | $V_{RD}$ | $V_{RD(S/A)}$ | $V_{SS}$ | $V_{SS}$ | $V_{CC}$ | $V_{CC}$ | $V_{SS}$ | $V_{SS}$ | $V_{CC}$ |
| Read Cell 42B | $V_{RD}$ | $V_{SS}$ | $V_{RD(S/A)}$ | $V_{SS}$ | $V_{CC}$ | $V_{SS}$ | $V_{CC}$ | $V_{SS}$ | $V_{CC}$ |

In Table II, program and read operations are performed on individual memory cells 42. Erase operations, however, are performed on a sector of memory cells. A sector includes all the memory cells 42 connected to the word line 26.

The voltages in Table II are $V_{cc}$, the source voltage, perhaps 5 V; $V_{SS}$, ground; $V_{PP}$, a positive programming voltage, perhaps 12 V; $-V_{EE}$, a negative programming voltage, perhaps −12 to 18 V; $V_{PPD}$, a drain voltage, perhaps 6 V; and $V_{RD}$ (S/A), a read voltage, perhaps 1–2 V: the S/A (sense amp) is connected to the bit line containing the bit to be read. The term "float" indicates a high impedance state. Dashes "-" indicate the state does not matter.

The above description makes clear that the present invention is well-adapted to carry out the objects and to attain the ends and advantages mentioned herein as well as those inherent in the invention. While presently preferred embodiments of the invention have been described for purposes of this disclosure, numerous changes may be made which will readily suggest themselves to those skilled in the art and which are encompassed within the spirit of the invention disclosed and as defined in the claims.

What is claimed is:

1. A method of making an array of electrically erasable and programmable read-only memory cells on a face of a semiconductor substrate of a first conductivity type having wells of a second conductivity type opposite the first type, comprising:

(a) forming a plurality of parallel elongated rectangular rows of field oxide on the face of a well;

(b) forming a plurality of rows of a first dielectric on the well, each row disposed between rows of field oxide;

(c) forming a first layer of polysilicon over the rows of field oxide and the rows of first dielectric;

(d) forming a layer of a second dielectric over the first layer of polysilicon;

(e) removing portions of the first layer of polysilicon and portions of the layer of second dielectric to form a plurality of columns of second dielectric and polysilicon disposed over the rows of field oxide and rows of second dielectric;

(f) removing portions of the rows of field oxide and rows of first dielectric to form a plurality of columns of field oxide regions and first dielectric regions disposed on the face of the well under the columns of second dielectric and polysilicon, each field oxide region and each first dielectric region having six rectangular sides;

(g) forming a plurality of parallel bit lines of the first conductivity type in the well, the bit lines being arranged in columns disposed between the columns of field oxide regions and first dielectric regions;

(h) forming a plurality of oxide spacers over the bit lines;

(i) forming a second layer of polysilicon over the oxide spacers and the columns of dielectric and polysilicon;

(j) removing portions of the second layer of polysilicon to form a plurality of word lines having a plurality of control gate regions, the word lines disposed in rows and extending over adjacent field oxide regions in the columns of field oxide regions, each word line defining a row of memory cells; and (k) removing portions of the columns of second dielectric and polysilicon disposed between the word lines to form a plurality of floating gate regions disposed under the word lines.

2. The method of claim 1 wherein steps (e) and (f) are performed using a single set of masks.

3. The method of claim 2 wherein step (a) comprises:

forming a layer of field oxide on the well; and removing selected portions of the field oxide to produce the plurality of parallel elongated rectangular rows of field oxide.

4. The method of claim 3 wherein the field oxide regions, first dielectric regions and floating gate regions have sides that align along each adjacent bit line, the sides being substantially aligned along the columns and in a vertical direction from the face of the wafer.

5. The method of claim 4 wherein the first conductivity type is n-type and the second conductivity type is p-type.

* * * * *